US011055260B2

(12) United States Patent
Burns

(10) Patent No.: US 11,055,260 B2
(45) Date of Patent: Jul. 6, 2021

(54) SYSTEM AND METHOD FOR COMPRESSION OF GEOSPATIAL LOCATION DATA

(71) Applicant: Live Earth, LLC, Austin, TX (US)

(72) Inventor: Zachary Burns, Austin, TX (US)

(73) Assignee: LIVE EARTH, LLC, Austin, TX (US)

( * ) Notice: Subject to any disclaimer, the term of this patent is extended or adjusted under 35 U.S.C. 154(b) by 54 days.

(21) Appl. No.: 16/717,731

(22) Filed: Dec. 17, 2019

(65) Prior Publication Data
US 2020/0192869 A1 Jun. 18, 2020

Related U.S. Application Data

(60) Provisional application No. 62/781,288, filed on Dec. 18, 2018.

(51) Int. Cl.
G06F 16/00 (2019.01)
G06F 16/17 (2019.01)
G06F 16/909 (2019.01)
G06F 16/29 (2019.01)
G06T 17/05 (2011.01)
G06F 16/387 (2019.01)

(52) U.S. Cl.
CPC .......... G06F 16/1727 (2019.01); G06F 16/29 (2019.01); G06F 16/387 (2019.01); G06F 16/909 (2019.01); G06T 17/05 (2013.01)

(58) Field of Classification Search
CPC .................................................. G06F 16/387
See application file for complete search history.

(56) References Cited

U.S. PATENT DOCUMENTS

2008/0016472 A1\* 1/2008 Rohlf .................. G06F 16/9537
715/848

\* cited by examiner

Primary Examiner — Ajith Jacob
(74) Attorney, Agent, or Firm — Sprinkle IP Law Group

(57) ABSTRACT

Systems and methods for the compression and decompression of geospatial locations are disclosed. The compression and decompression are based on a prediction of the geospatial location and a geometrical projection of the Earth.

18 Claims, 8 Drawing Sheets

SYSTEM AND METHOD FOR COMPRESSION OF GEOSPATIAL LOCATION DATA

RELATED APPLICATIONS

This application claims a benefit of priority under 35 U.S.C. 119 to U.S. Provisional Patent Application Ser. No. 62/781,288, filed Dec. 18, 2018, entitled "SYSTEM AND METHOD FOR COMPRESSION OF GEOSPATIAL LOCATION DATA," by Burns, which is incorporated herein in its entirety by reference.

COPYRIGHT NOTICE

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

TECHNICAL FIELD

This disclosure relates generally to the compression of data. In particular, this disclosure relates to the compression of geospatial location data. Specifically, embodiments disclosed herein relate to the compression of geospatial location data in geospatial information systems, including embodiments that reduce storage or bandwidth requirements of such systems.

BACKGROUND

Geospatial information systems are utilized for capturing, storing, analyzing or otherwise managing geographic data and associated attributes which are spatially referenced to the earth. This geospatial information can be gathered from multiple, disparate sources, and used to build a unified, coherent data store which is managed by a geospatial information provider. The geospatial information gathered in the data store can then be provided to various other entities that require geospatial information for their operation over a computer network. For example, geospatial information may be utilized by delivery companies, online map services that provide map information and routing information to end users, among many others.

These geospatial information system may thus receive and process a large amount of geospatial event data, including geospatial location data. Moreover, geospatial information systems may provide this geospatial event data (including this geospatial location data) over the computer network in response to a high volume of requests. Accordingly, when managing this geospatial location data (e.g., storing or transmitting such data) providers and users of geospatial information systems are often forced to make a difficult choice between utilizing more storage and network bandwidth, or of running a simplification process which would represent geospatial data less accurately.

What is desired is the ability to represent geospatial locations in a manner that reduces the data and computing resources used to store or transmit such geospatial locations, or allows more geospatial locations to stored or transmitted under a given set of storage and bandwidth limitations.

SUMMARY

To those ends, among others, embodiments as disclosed herein are directed to systems and methods for compressing geospatial location data. To compress a geospatial location, a prediction for that geospatial location may be determined. It will be understood that for purposes of this disclosure a prediction of a geospatial location may be any reference point that may be determined in order to compress or decompress the geospatial location. Such a prediction may therefore be a known reference location (e.g., including a static location), may be a prediction created by an algorithmic determination of a location (for example, based on a bounded geographical area or a previous geospatial location in a set of geospatial locations) or may be otherwise created.

According to embodiments, a geometrical projection of the Earth can then be created. A projection is a systematic transformation of the latitudes and longitudes of locations from the surface of a sphere or an ellipsoid into locations on a geometric shape. In some embodiments, a cubic projection of the Earth may be utilized. The faces of the cubic projection can also be subdivided using a number of subdivisions per face to subdivide each face of the cubic projection to create a set of vertices on each face of the cubic projection. The number of subdivisions (e.g., the number of horizontal or vertical axes selected for use) may be selected based on a desired precision or desired amount of compression (or balance therebetween) for the geospatial location, with a higher number of axes resulting in relatively greater accuracy (with relatively less compression) and a fewer number of axes resulting in relatively greater compression (with relatively less accuracy).

In one embodiment, the vertices created by the subdivisions (e.g., the intersections of the axes used to subdivide the cubic projection) can then be assigned identifiers. The number assigned to the nearest vertex to the geospatial location to be compressed can then be determined. Specifically, in one embodiment, the geospatial location to be compressed can be projected onto the cubic projection (e.g., on a corresponding face of the cubic projection). The vertex (e.g., as defined by the subdivisions on the corresponding face of the cube) nearest to the projected geospatial location on the cube face, and the associated number of this nearest vertex can then be determined It is this vertex number that is the compressed geospatial location.

To decompress such a compressed geospatial location, substantially the reverse set of operations may be performed. Specifically, when a compressed geospatial location is received (e.g., as an integer value in a variable integer length format), a prediction of that geospatial location may be created. The method used in predicting the geospatial location when decompressing the received geospatial location may be equivalent to (the same as or substantially similar to) the method used to predict the geospatial location during compression. In this manner, the resulting prediction during decompression may be substantially equivalent to (or the same as or substantially similar to) the prediction obtained when the geospatial location was compressed.

A geometrical projection of the Earth can then be created. Again, the geometrical projection may be equivalent to (or the same as or substantially similar to) the geometrical projection used during compression of the geospatial location. At this point then, during decompression, a prediction and cubic projection with subdivisions and vertices with numerical assignments equivalent to those created during compression may have been created. The number of the vertex of the subdivided cubic projection equivalent to the integer value of the compressed geospatial location may then be determined and this vertex projected back to its corresponding location on Earth to determine the decompressed latitude and longitude value (e.g., the determined corresponding location on Earth).

As a geospatial location may thus be compressed (e.g., into a single integer) and stored or transmitted using, for example, a variable length integer format, a number of advantages and technical improvements may be realized. As one advantage, by having a location represented by a single numerical value (as opposed to say, separate latitude and longitudes or a difference for each of latitude and longitude) there is only overhead for one value (e.g., one variable length integer) instead of two. Moreover, by creating an ordering of locations that increases with distance from a prediction (e.g., spirals out from the prediction), the number of bits needed to store a geospatial location is correlated with the distance from that prediction. Additionally, by using a cubic projection to compress geospatial locations, precision is roughly equally distributed throughout the Earth, instead of being concentrated at the north and south pole away from where most data resides. As a result of these advantages, both alone and in combination, embodiments as disclosed herein may provide substantial technical advantages and improvements in computing systems, including the use of less storage space for storing these geospatial locations (e.g., fewer bytes) while maintaining high precision of such geospatial locations. Moreover, less bandwidth may be required to transmit one or more geospatial locations, reducing transmission times for such geospatial locations.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

Figure 1A:
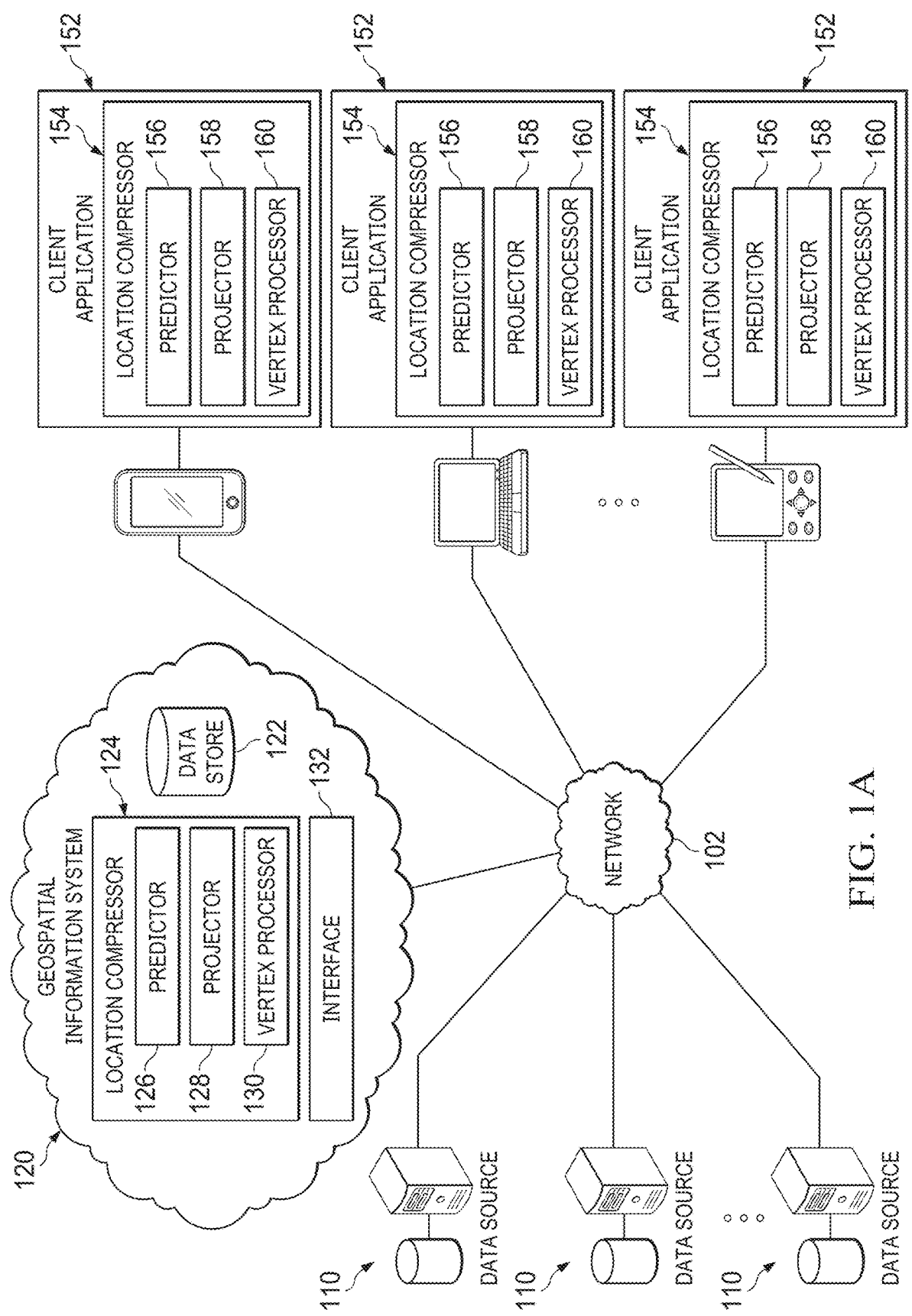
FIG. 1A is a diagrammatic representation of an architecture including a geospatial information system including an embodiment of a location compressor.

The invention and the various features and advantageous details thereof are explained more fully with reference to the nonlimiting embodiments that are illustrated in the accompanying drawings and detailed in the following description. Descriptions of well-known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Before discussing specific embodiments, some additional context may be useful. As discussed, geospatial information system provider may compile geospatial information and maintain a geospatial information system. The geospatial information can be gathered from multiple, disparate sources, and used to build a unified, coherent data store which is managed by the geospatial information provider. The geospatial information gathered in the data store can then be provided to various other entities that require geospatial information for their operation over a computer network. For example, geospatial information may be utilized by delivery companies, online map services that provide map information and routing information to end users, among many others.

Increasingly, objects are being connected electronically or communicatively in ways that previously were the province mostly of computers. As such, the term "Internet of Things" (IoT) has come to describe a dynamic network of globally connected things, entities, devices, items or objects. In fact, almost any device with a sensor of some type can be connected to a computer network or otherwise monitored. Thus, geospatial information systems may now obtain geospatial information data relating to weather monitors, traffic devices (e.g., air traffic, road traffic, marine traffic, etc.), devices for delivery fleets, devices related to lighting, parking, water flow for bodies of water or city utilities, seismographic data, computing device, video cameras, devices monitoring building status, or a whole host of other devices or systems. As can be seen, as the number and complexity of interconnected items in an IoT has grown exponentially, the tracking, monitoring and identification of these interconnected things becomes all the more challenging.

In particular, not only is it desired to track a large number of items, it is desired to track these items both historically and in real-time. Thus, in some cases a geospatial information system may receive hundreds of millions of geospatial data events (or more) from various information sources each day, where this geospatial event data may include geospatial location data. Moreover, that geospatial information system may provide this geospatial event data, including this geospatial location data in response to hundreds of thousands or millions of requests each day. As a result, millions or billions (or more) sets of geospatial location data may be stored and regularly updated at a geospatial information system, or provided over a computer network from the geospatial information system to entities that require such geospatial data.

Typically, such geospatial location data is stored as tuples of latitude and longitude pairs in IEEE 754 double-precision binary floating point format. Thus, for a single geospatial location 128 bits may be required. As can be imagined, the storage or transfer of geospatial location data according to this format in the environments described may result in significant burden on the storage and network bandwidth requirements. Moreover, because of the very nature of the latitude and longitude coordinate system, the greatest precision in representing locations in that coordinate system lies near the poles of the Earth. However, as can be imagined, the vast majority of most geospatial location data obtained and provided by geospatial location systems is not located near the poles. The latitude and longitude coordinate system thus has a non-uniform distribution of precision, with the least precision being available in locations where the most precision is desired and, conversely, the most precision available where less precision may be needed. It will be noted here that while the geospatial location system of latitude/longitude are utilized in the description of certain embodiments as disclosed, embodiments as used herein may be usefully applied to compress and decompress geospatial location represented in another manner. By way of example, such a geospatial location to be compressed could be represented in Mercator projection, or another Geographic Coordinate System like 3D Cartesian coordinates, and such locations could be compressed and decompressed using embodiments as disclosed.

Accordingly, providers and users of geospatial information systems are often forced to make a difficult choice between utilizing more storage and network bandwidth, or of running a simplification process which would represent geospatial data less accurately with fewer points.

As such, what is desired is the ability to compress geospatial locations such that these geospatial locations can be represented (e.g., in a binary format) using less data (e.g., fewer bytes) and the computing resources to store or transmit such geospatial locations may be reduced, or more geospatial locations may be stored or transmitted under a given set of storage and bandwidth limitations.

To those ends, among others, embodiments as disclosed herein are directed to systems and methods for compressing geospatial location data. To compress a geospatial location, a prediction for that geospatial location may be determined. It will be understood that for purposes of this disclosure a prediction of a geospatial location may be any reference point that may be determined in order to compress or decompress the geospatial location. Such a prediction may therefore be a known reference location (e.g., including a static location), may be a prediction created by an algorithmic determination of a location (for example, based on a bounded geographical area or a previous geospatial location in a set of geospatial locations) or may be otherwise created.

A geometrical projection of the Earth can then be created. A projection is a systematic transformation of the latitudes and longitudes of locations from the surface of a sphere or an ellipsoid into locations on a geometric shape. In some embodiments, a cubic projection of the Earth may be utilized. One example of a cubic projection that may be utilized is a quadrilateralized spherical cube (QSC). Such a projection is an equal-area projection that introduces only limited angular distortions and treats all cube sides equally (i.e., it does not use different projections for polar areas and equatorial areas). The cubic projection may thus be created such that the prediction is in one of the corners of the cubic projection.

The faces of the cubic projection can also be subdivided using a number of subdivisions per face to subdivide each face of the cubic projection to create a set of vertices on each face of the cubic projection. These subdivisions may occur, for example along horizontal and vertical axes of the faces of the cubic projections. The number of subdivisions (e.g., the number of horizontal or vertical axes selected for use) may be selected based on a desired precision or desired amount of compression (or balance therebetween) for the geospatial location, with a higher number of axes resulting in relatively greater accuracy (with relatively less compression) and a fewer number of axes resulting in relatively greater compression (with relatively less accuracy).

The vertices created by the subdivisions (e.g., the intersections of the axes used to subdivide the cubic projection) can then be assigned identifiers. In one embodiment, the vertex of the cubic projection corresponding to the prediction may be assigned a lowest numerical identifier (e.g., zero) and the other vertices may be assigned numerical identifiers in increasing order starting with the vertex or vertices closest to the vertex corresponding to the prediction (e.g., vertex zero). For example, the vertices may be assigned increasing numerical identifiers according to a "ring order" defined by a spiral pattern beginning with the prediction vertex (e.g., vertex zero) and increasing in a clockwise or counter-clockwise pattern around the prediction vertex.

The number assigned to the nearest vertex to the geospatial location to be compressed can then be determined. Specifically, in one embodiment, the geospatial location to be compressed can be projected onto the cubic projection (e.g., on a corresponding face of the cubic projection). The vertex (e.g., as defined by the subdivisions on the corresponding face of the cube) nearest to the projected geospatial location on the cube face, and the associated number of this nearest vertex can then be determined (e.g., using a Euclidean distance measure or the like). It is this vertex number that is the compressed geospatial location. This number may be stored or transmitted using, for example, a variable length integer format such as PrefixVarint, LEB128 or the like.

To decompress such a compressed geospatial location, substantially the reverse set of operations may be performed. Specifically, when a compressed geospatial location is received (e.g., as an integer value in a variable integer length format), a prediction of that geospatial location may be created. The method used in predicting the geospatial location when decompressing the received geospatial location may be equivalent to (or the same as) the method used to predict the geospatial location during compression. In this manner, the resulting prediction during decompression may be substantially equivalent to (or the same as or substantially similar to) the prediction obtained when the geospatial location was compressed.

A geometrical projection of the Earth can then be created. Again, the geometrical projection may be equivalent to (or the same as or substantially similar to) the geometrical projection used during compression of the geospatial location. Therefore, in one embodiment, a QSC projection may be created during decompression, where the prediction created during decompression is in one of the corners of the cubic projection. The faces of this cubic projection can also be subdivided and ordered using a number of subdivisions per face and an ordering scheme equivalent to (or the same as or substantially similar to) the number of subdivisions created during the compression of the geospatial location. At this point then, during decompression, a prediction and cubic projection with subdivisions and vertices with numerical assignments equivalent to (or the same as or substantially similar to) those created during compression may have been created. The number of the vertex of the subdivided cubic projection equivalent to the integer value of the compressed geospatial location may then be determined and this vertex projected back to its corresponding location on Earth to determine the decompressed latitude and longitude value (e.g., the determined corresponding location on Earth).

As a geospatial location may thus be compressed into a single integer and stored or transmitted using, for example, a variable length integer format, a number of advantages and technical improvements may be realized. As one advantage, by having a location represented by a single numerical value (as opposed to say, separate latitude and longitudes or a difference for each of latitude and longitude) there is only overhead for one value (e.g., one variable length integer) instead of two. Moreover, by creating an ordering of locations that increases with distance from a prediction (e.g., spirals out from the prediction), the number of bits needed to store a geospatial location is correlated with the distance from that prediction. Additionally, by using a cubic projection to compress geospatial locations, precision is roughly equally distributed throughout the Earth, instead of being concentrated at the north and south pole away from where most data resides. As a result of these advantages, both alone and in combination, embodiments as disclosed herein may provide substantial technical advantages and improvements in computing systems, including the use of less storage space for storing these geospatial locations (e.g., fewer bytes) while maintaining high precision of such geospatial locations. Moreover, less bandwidth may be required to transmit one or more geospatial locations, reducing transmission times for such geospatial locations.

It may now be useful to an understanding of embodiments to discuss a computer network environment including a geospatial information system where embodiments of geospatial compression as discussed may be usefully employed. It will be understood that the description of such geospatial information systems and their use are provided by way of example, and are not intended to serve as limitations or constraints on the implementation or use of embodiments of the systems and methods for the compression of geospatial locations disclosed herein. Generally, then, the embodiments of the systems and methods for compression of geospatial locations as disclosed may be usefully applied in almost any computing environment where geospatial locations may be utilized, stored or transmitted with the commensurate advantages as discussed.

With reference to FIG. 1A, then, geospatial information system 120 may compile geospatial information including geospatial locations from multiple, disparate sources 110 over network 102 which may be the Internet, an intranet, a cellular network, another type of wireless or wired network or some combination of these types of networks. As discussed, these information sources 110 may include data sources associated with weather monitors, traffic devices (e.g., air traffic, road traffic, marine traffic, etc.), devices for delivery fleets, devices related to lighting, parking, water flow for bodies of water or city utilities, seismographic data, computing devices, video cameras, devices monitoring building status, or a whole host of other entities, devices or systems. The geospatial information obtained from the geospatial data information sources 110 can be stored in data store 122 maintained by the geospatial information system 120.

The geospatial information in the data store 122 or associated data can then be provided to various other entities that require geospatial information for their operation over network 102 through, for example, a services or other type of interface 132. As but one example, a client application 152, that may be a thin client application, a thick client application, a web-based application or another type of application, may request or receive certain geospatial location data through the interface 132 of geospatial information system 120. The geospatial information system 120 may obtain the requested geospatial location data and return it to the requesting client application 152 through the interface 132, where the client application 152 may use the geospatial locations or other geospatial data to, for example, present an interface to a user.

Figure 1B:
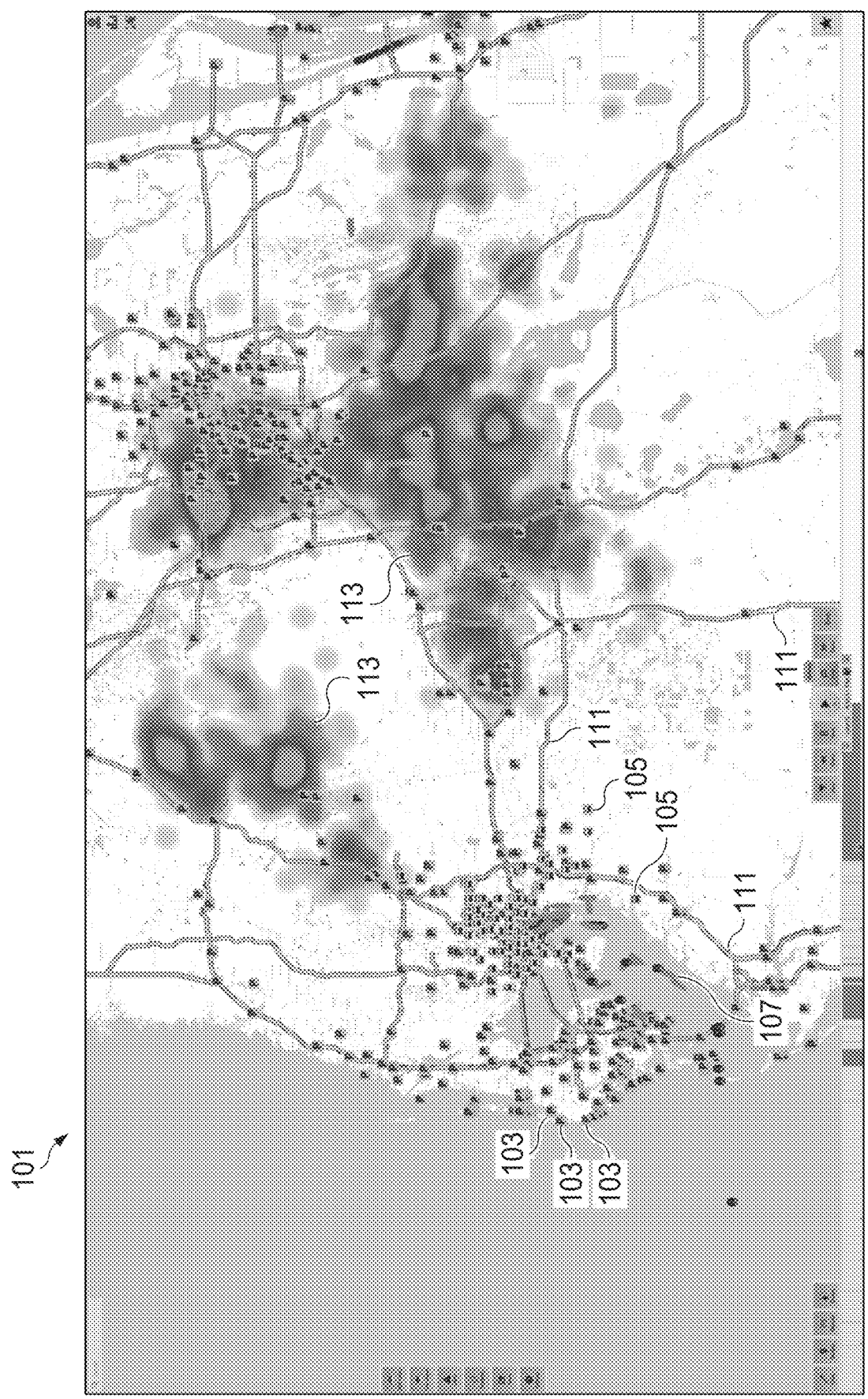
FIG. 1B is a depiction of an interface that may be utilized with embodiments of a geospatial information system.

Referring briefly to FIG. 1B, one embodiment of just such an interface is depicted. This interface 101 depicts a geographical area with a set of icons representing various entities, where each of these entities is associated with a geospatial location. Thus, here, a client application 152 may request geospatial data on a set of specified entities in a specified geographical area and geospatial information system 120 can return geospatial data on these entities to the requesting client application 152 (or such geospatial data may be sent from geospatial information system at a regular time interval, etc.), including the geospatial location associated with each of the specified entities. The client application 152 can then render the interface 101 to present to the user at the user's device. The interface 101 may depict the geographical area and an icon for each of the specified entities where the icon for the presented entity may be displayed relative to the depicted geographical area at the corresponding geospatial location. The various entities may also be depicted in other manners (e.g., other than individual icons), such as a heat or distribution map, etc.

In the instant example, the specified set of entities may include parking lots, lightning strikes, busses, ships and traffic flows. The geospatial data on these specified entities determined by the geospatial information system 120 (and provided to the client application 152) may be different per each entity type (or even individual entities) and may include, for example, data on an icon used to represent the entity in the interface, a geospatial location (e.g., position) of the entity, a heading (e.g., a direction of movement), a timestamp (e.g., at which the data was determined or received about the entity) or other attributes for an entity. It will be noted that additionally, the geospatial data returned for an entity (or set of entities) may be different, or include more or less geospatial data, based on the manner in which the entity (or set of entities) is to be displayed through the interface (e.g., which may be specified by the client interface 152 in a request for geospatial data on the specified entities). Moreover, the type or amount of geospatial data provide by geospatial information system 120 for each entity may be different (even with respect to the same entity) at different points based on a number of criteria.

Continuing with this example, for parking lot entities, the geospatial information system 120 may include geospatial data on an icon that may be variable per event or specific to the entity (e.g., based on how full the parking lot is), the position (e.g., the geospatial location) that may be variable per entity, and a timestamp that can be variable per the event. For lightning strikes, the geospatial information system 120 may include geospatial data on an icon that may be variable per event or specific to the entity, the position (e.g., the geospatial location where the lighting strike occurred) may be variable per entity, and a timestamp that can be variable per the event. For busses the geospatial information system 120 may include geospatial data on an icon that may be fixed, the position (e.g., the geospatial location where the lighting strike occurred) that may be variable per entity, and a timestamp that can be variable per the event. For ships, the geospatial information system 120 may include geospatial data on an icon that may be variable per event, the position (e.g., the geospatial location) that may be variable per entity, a heading that may be variable, and a timestamp that can be variable per the entity. For traffic flows, the geospatial information system 120 may include geospatial data on the map of roads (e.g., where roads segments are, attributes associated with a road such as the road name, or other information) and geospatial data on the speeds of traffic on the roads.

Thus, based on the geospatial data returned by the geospatial information system 120 the client interface 152 may render the interface 101. This interface 101 may include icons 103 for parking lot entities where those icons 103 are depicted at their corresponding geospatial location with respect to the depicted geographic area. Similarly, the interface may include icons 105 for busses and icons 107 for ships, each icon 105, 107 depicted at their corresponding geospatial location with respect to the depicted geographic area. The interface 101 may also include roads 111 depicted at their geospatial location, where the roads 111 may be depicted with some indication of the speed of traffic on those roads 111 (e.g., by depicting the roads 111 in a color indicative of the speed of traffic). In this example, instead of depicting individual lightning strikes in the example interface 101 a "heat map" of lightning strikes is depicted based on the geospatial locations of the entire set of lightning strikes occurring in the geographical area (e.g., within a previous time period). This heat map 113 may be a graphical representation of the lightning strike events, where the individual lighting strike events or a concentration of the lightning strike events are represented as colors. Such a heat map may be, for example, a visualization of a density function applied to the lightning strike events.

Returning to FIG. 1A, as can be seen, and as discussed above, as a high volume of geospatial location data may be both stored by the geospatial information system 120 and transmitted over network 102 to a large number of client applications 152 it may be advantageous to compress these geospatial locations to reduce the storage and bandwidth requirements in these contexts and improve transmission times of geospatial locations.

To achieve such compression, the geospatial information system 120 may include a location compressor/decompressor 124 (referred to without loss of generality as a compressor herein) while client application may include location compressor/decompressor 154 (again referred to without loss of generality as a compressor herein). In some embodiments, location compressor 124 and location compressor 154 may be substantially similar or the same.

Location compressor 124 may comprise predictor 126, projector 128 and vertex processor 130 that may include, for example. instructions embodied on a non-transitory computer readable medium. The predictor 126 may be adapted to predict a geospatial location for a geospatial location to be compressed. Projector 128 may be adapted to create a geometrical projection of the Earth such as a quadrilateralized spherical cube, where the prediction is in one of the corners of the cubic projection. Projector 128 can also subdivide the created cubic projection to create a set of vertices on each face of the cubic projection and assign identifiers to the vertices. Vertex processor 130 is adapted to determine the number assigned to the vertex of the subdivided cubic projection nearest to the geospatial location to be compressed. This number may be stored (e.g., in the data store 122) or transmitted to the client application 152 using, for example, a variable length integer format. Accordingly, location compressor 124 may compress geospatial locations as they are received from data source 110 before they are stored in data store 122 or when they are retrieved from data store 122 and before they are transmitted to a client application 152. It will be noted here, that this step is given by way of illustration only, and that such an ordering may be implicit and identifiers of the vertices need not be explicitly assigned or stored. As will be realized from this disclosure, the identifier associated with a particular vertex may be determined at the time a nearest vertex to a prediction is determined as discussed herein, and only the identifier associated with a particular vertex or set of vertices may need to be determined.

Similarly, location compressor 154 at client application 152 may include predictor 156, projector 158 and vertex processor 160 that may include, for example, instructions embodied on a non-transitory computer readable medium. The predictor 156 may be adapted to predict a geospatial location for a geospatial location to be decompressed. The method used in predicting the geospatial location when decompressing the received geospatial location may be equivalent to the method used to predict the geospatial location during compression by compressor 124. Projector 158 may be adapted to create a geometrical projection of the Earth such as a quadrilateralized spherical cube, where the prediction is in one of the corners of the cubic projection. Projector 158 can also subdivide the created cubic projection to create a set of vertices on each face of the cubic projection and assign identifiers to the vertices. The cubic projection and associated subdivisions and vertices with numerical assignments may be created in an equivalent manner to those created during compression by projector 128. Vertex processor 160 is adapted to determine the vertex of the subdivided cubic projection equivalent to the integer value of the compressed geospatial location and project this vertex back to its corresponding location on Earth to determine the decompressed latitude and longitude value (e.g., the determined corresponding location on Earth). Accordingly, location compressor 154 may decompress compressed geospatial locations as they are received over network from geospatial information system 120 at client application 152 and provide these decompressed geospatial locations to client application 152 for use.

Figure 2:
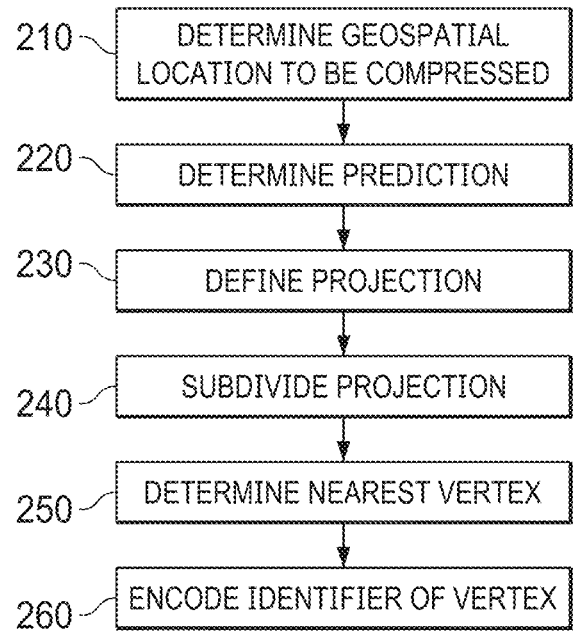
FIG. 2 is a flow diagram depicting one embodiment of a method for compressing a geospatial location.

Moving now to FIG. 2, a flow diagram for one embodiment of a method for the compression of a geospatial location is depicted. Such a method may be employed, for example, by the location compressor 124 of the geospatial information system 120 depicted in FIG. 1A. Initially, at step 210, it can be determined that a geospatial location is to be compressed. This geospatial location may be a single geospatial location or one of a set of geospatial locations that are to be compressed. These geospatial locations may be, for example, geospatial locations to be stored in a data store, or geospatial locations that are being retrieved from a data store and being compressed for transmission. As an example, a geospatial location may be a geospatial location associated with a single entity (e.g., a bus, a parking structure, a ship, etc.), a set of geospatial location associated with an entity, or a set of geospatial locations associated with multiple entities, etc.

At step 220 a prediction of the geospatial location to be compressed may be determined. As discussed, it will be understood that for purposes of this disclosure a prediction of a geospatial location may be any reference point (e.g., a geospatial location) that may be determined in order to compress or decompress the geospatial location to be compressed/decompressed. There are thus many available methods that may be utilized to create a prediction for a geospatial location to be compressed, including but not limited to using a known reference location (e.g., a location within a particular geographical area), looking at statistical averages, using the previous point in a series (e.g., a series of geospatial locations such as those that might be sent to represent an entity or set of entities) as the prediction (e.g., when the geospatial location to be compressed is one of a set of geospatial locations to be compressed), or in the case of time-series data (e.g., when the geospatial location to be compressed is one of a set of geospatial locations associated with a moving object) extrapolating based on a moving object's speed, heading, and last location. The method utilized to create a prediction may be selected based on the application domain such that the prediction may be tailored to the domain or field associated with the geospatial data being compressed.

A geometrical projection of the Earth can then be defined at step 230 and subdivided at step 240. A projection is a systematic transformation of the latitudes and longitudes of locations from the surface of a sphere or an ellipsoid into locations on a geometric shape. In some embodiments, a cubic projection of the Earth may be utilized. One example of a cubic projection that may be utilized is a quadrilateralized spherical cube (QSC). Such a projection is an equal-area projection that introduces only limited angular distortions and treats all cube sides equally (i.e., it does not use different projections for polar areas and equatorial areas). The cubic projection may thus be created such that the prediction is in one of the corners of the cubic projection (e.g., is located at the corner of the cubic projection, such that the geospatial location of the prediction is in, or close to, a corner of the cubic projection).

The faces of the cubic projection can be subdivided using a number of subdivisions per face to subdivide each face of the cubic projection to create a set of vertices on each face of the cubic projection. These subdivisions may occur, for example along horizontal and vertical axes of the faces of the cubic projections. The number of subdivisions (e.g., the number of horizontal or vertical axes selected for use) may be selected based on a desired precision or desired amount of compression (or balance therebetween) for the geospatial location, with a higher number of subdivisions resulting in relatively greater accuracy (with relatively less compression), and a fewer number of axes resulting in relatively greater compression (with relatively less accuracy). The vertex of the corner corresponding to the predicted geospatial location (or the nearest corner vertex to the predicted geospatial location) may be referred to as the prediction vertex.

Figure 3A:
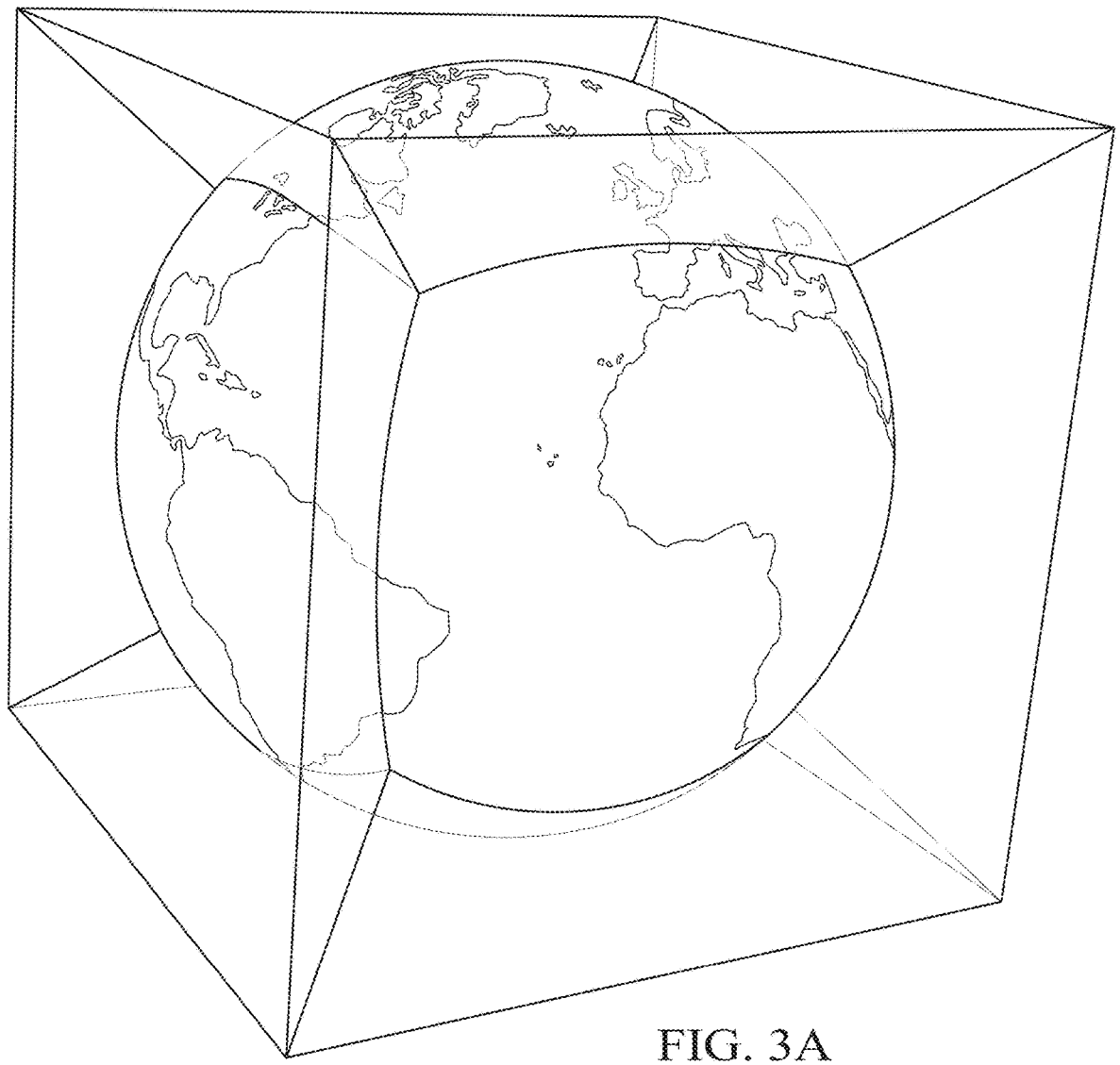
FIGS. 3A and 3B are diagrammatic representations of examples of cubic projections.
Figure 3B:
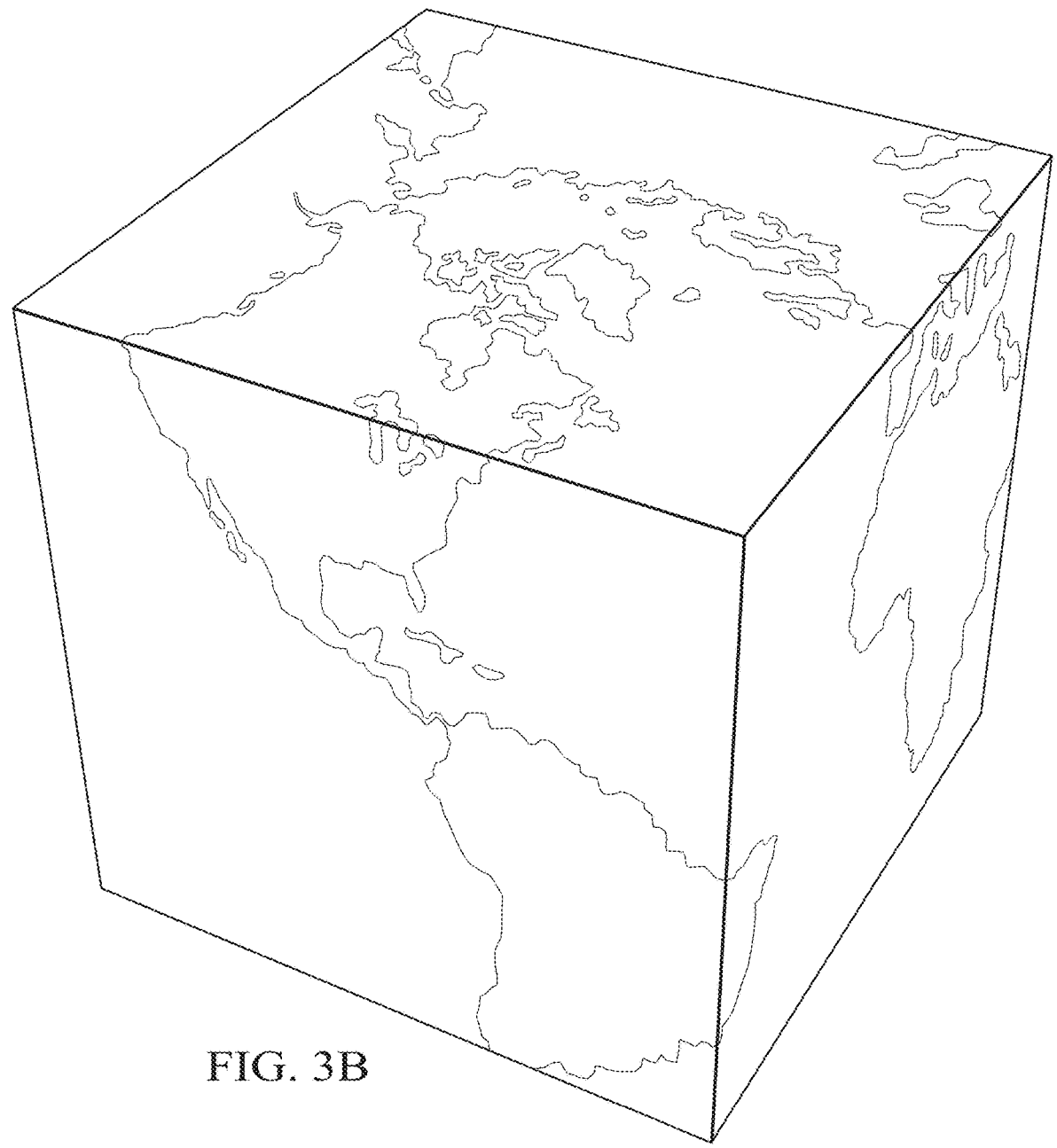
Figure 3C:
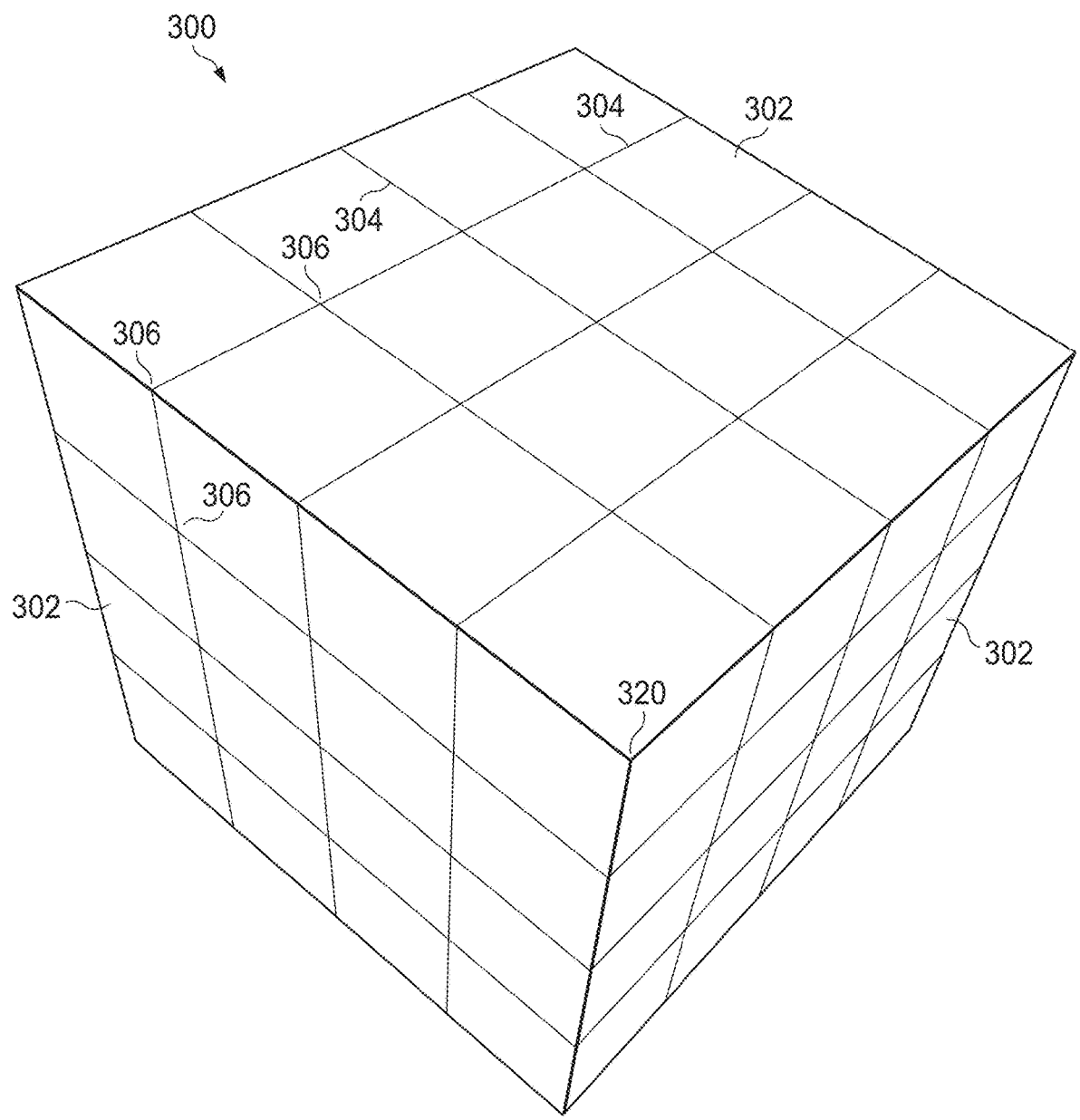
FIG. 3C is a diagrammatic representation of an example of a cubic projection with subdivided faces.

Referring briefly to FIGS. 3A-3C, in FIGS. 3A and 3B example diagrams of cubic projections of the Earth are depicted, while in FIG. 3C a diagram of an example subdivided cubic projection 300 is depicted. For purposes of this example, assume corner 320 is aligned with the prediction (e.g., the predicted geospatial location created in step 230).

Here, faces 302 of cubic projection are subdivided by axes (e.g., axes 304) to create vertices (e.g., vertices 306) on each face 302 of cubic projection.

Returning now to FIG. 2, based on the subdivided cubic projection, a number assigned to a nearest vertex to the geospatial location to be compressed can be determined at step 250. Specifically, in one embodiment, the geospatial location to be compressed (e.g., the actual latitude and longitude of the geospatial location) can be projected onto the cubic projection (e.g., on a corresponding face of the cubic projection). The nearest vertex to the projected point corresponding to the projected geospatial location as defined by the subdivisions (e.g., on the corresponding face of the cube) can be identified (e.g., using a Euclidean distance measure or the like), and the associated numerical (or other type of) identifier for the nearest vertex, can then be determined. The determined associated numerical identifier for the nearest vertex (the vertex identifier) can then be encoded at step 260 using a format for representing integers, including for example a variable length integer format such as PrefixVarint, LEB128 or the like. It is this (e.g., encoded) vertex number that is the compressed geospatial location. This (e.g., encoded) vertex number may then be stored or transmitted using, for example, the format for representing integers in which it is encoded (e.g., a variable length integer format).

In certain embodiments, to determine the nearest vertex, the vertices created by the subdivisions (e.g., the intersections of the axes used to subdivide the cubic projection) can be assigned identifiers. For example, the vertex of the cubic projection corresponding to the prediction (e.g., the predicted geospatial location that may be at, or near, a corner of the geometrical projection) may be assigned a lowest numerical identifier (e.g., zero) and the other vertices may be assigned numerical identifiers in increasing order starting with the vertex or vertices closest to the vertex corresponding to the prediction (e.g., vertex zero). For example, the vertices may be assigned increasing numerical identifiers according to a "ring order" defined by a spiral pattern beginning with the prediction vertex (e.g., vertex zero) and increasing in a clockwise or counter-clockwise pattern around the prediction vertex. It will be noted here, that this step is given by way of illustration only, and that such an ordering may be implicit and identifiers of the vertices need not be explicitly assigned or stored. As will be realized from this disclosure, the identifier associated with a particular vertex may be determined at the time a nearest vertex to a prediction is determined as discussed herein, and only the identifier associated with a particular vertex or set of vertices may need to be determined. Moreover, while numerical identifiers are given by way of example, any type of identifiers that allow vertices to be uniquely identified may be utilized.

Figure 3D:
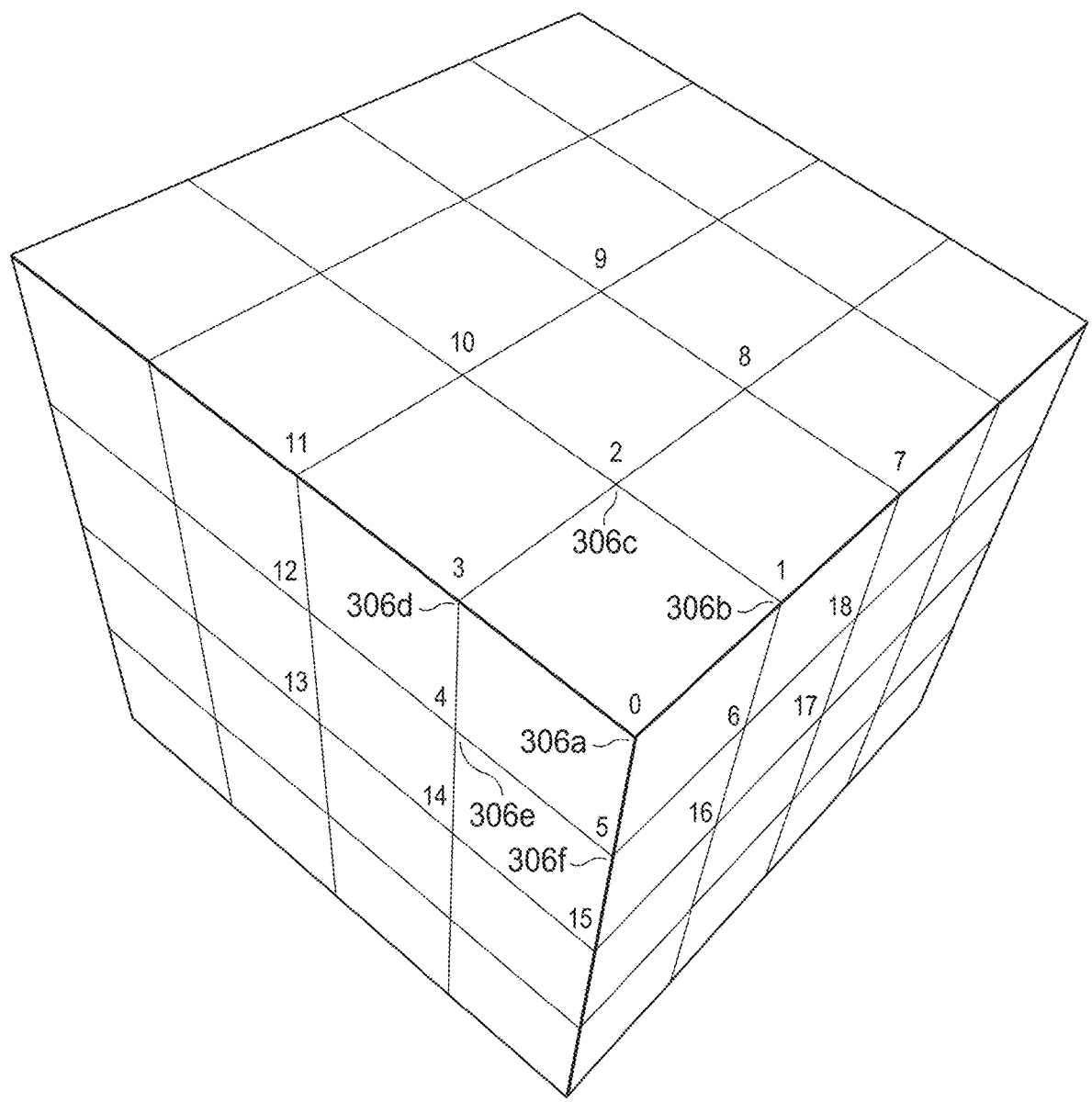
FIG. 3D is a diagrammatic representation of an example of a cubic projection with subdivided faces and identifiers assigned to vertices.

Looking briefly at FIG. 3D, a diagram of an example subdivided cubic projection with identifiers assigned to the vertices is depicted. Here, vertex 306a corresponding to the prediction (e.g., the prediction vertex corresponding to the predicted geospatial location) is assigned numerical identifier "0", vertex 306b is assigned the numerical identifier "1", vertex 306c is assigned the numerical identifier "2", vertex 306d is assigned the numerical identifier "3", vertex 306e is assigned the numerical identifier "4", vertex 306f is assigned the numerical identifier "5" and so on such that the vertices 306 are assigned increasing numerical identifiers according to a spiral pattern beginning with the prediction vertex 306a (e.g., vertex zero) and increasing in a clockwise or counter-clockwise pattern around the prediction vertex 306a. It will be noted that the assignment of numerical identifiers according to a spiral pattern or in a clockwise or counter-clockwise direction are given by way of example, other methods of assigning identifiers, including manners in which lower number or shorter identifiers are assigned closer to the prediction, may be utilized and are fully contemplated herein.

Figure 3E:
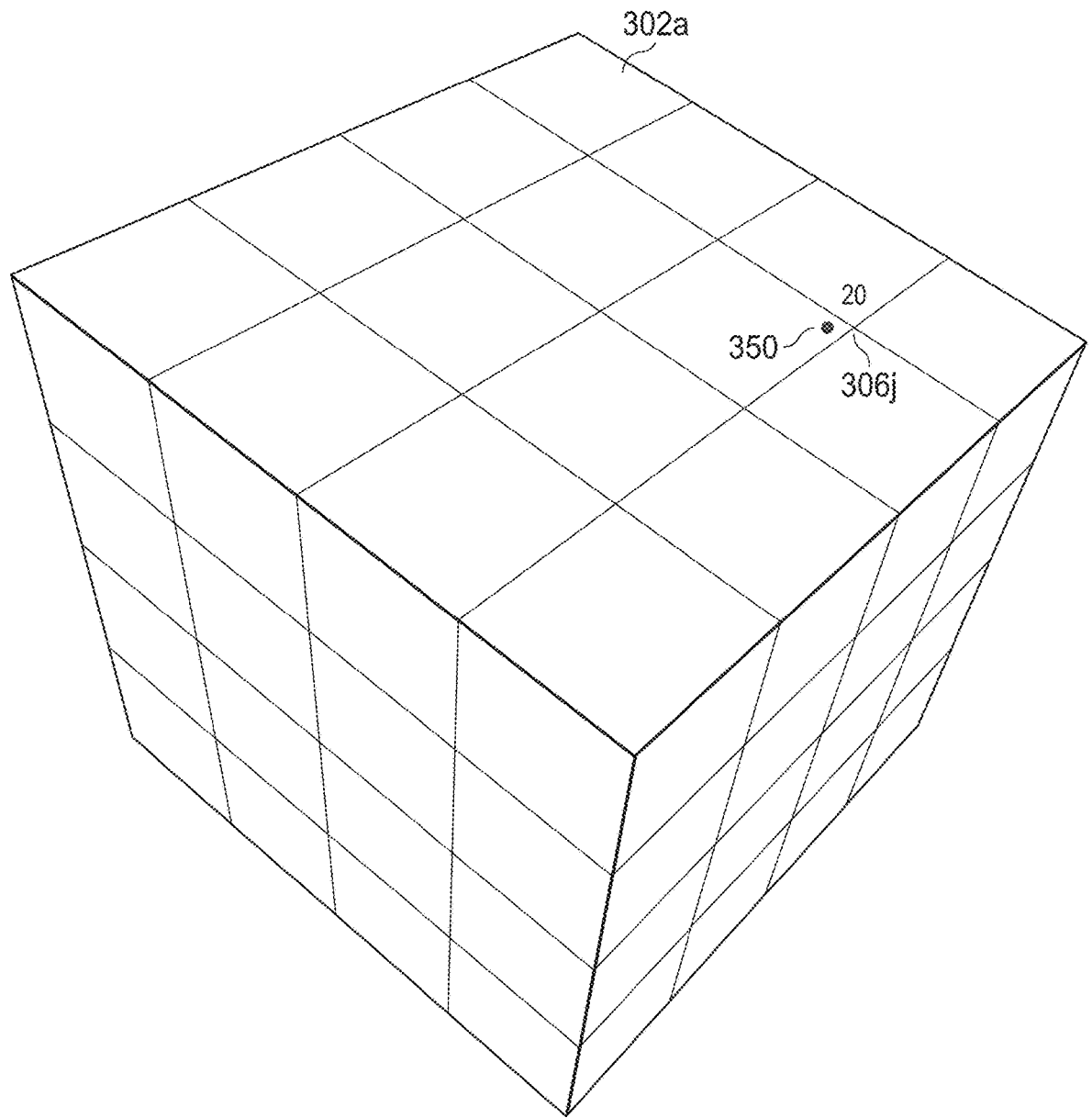
FIG. 3E is a diagrammatic representation of an example of a cubic projection with subdivided faces and an identifier assigned to a nearest vertex.

Referring now the example in FIG. 3E, a diagram of an example subdivided cubic projection is depicted. For purposes of this example, assume that point 350 is the projection of the actual geospatial location to be compressed on face 302*a* of the cubic projection. In this example, it can be determined that vertex 306*j* is the nearest vertex to the project point 350. It can also be determined that this vertex 306*j* is associated with the numerical identifier "20". Thus, in this example the numerical value 20 will serve as the compressed geospatial location.

Figure 4:
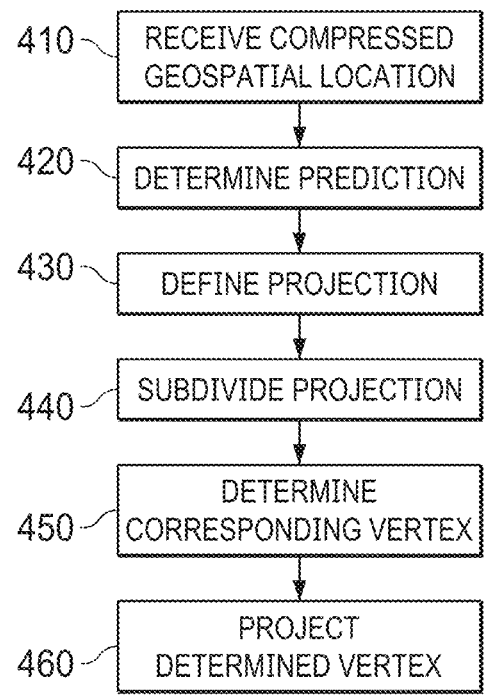
FIG. 4 is a flow diagram depicting one embodiment of a method for decompressing a geospatial location.

To decompress such a compressed geospatial location, substantially the reverse set of operations may be performed. FIG. 4 depicts a flow diagram for one embodiment of just such a method for the decompression of a geospatial location. Such a method may be employed, for example, by the location compressor 154 of the client 152 depicted in FIG. 1A. At step 410, a compressed geospatial location may be received (e.g., as an integer value in a variable integer length format). This compressed geospatial location may be a single geospatial location or one of a set of geospatial locations (e.g., a set of compressed geospatial locations) that are received.

At step 420 a prediction of the geospatial location to be compressed may be determined. The method used in predicting the geospatial location when decompressing the received geospatial location may be equivalent to (or the same as or substantially similar to) the method used to predict the geospatial location during compression (e.g., at step 220). In this manner, the resulting prediction during decompression may be substantially equivalent to (or the same as or substantially similar to) the prediction obtained when the geospatial location was compressed. There are thus many available methods that may be utilized to create a prediction for a geospatial location to be compressed, including but not limited to using a known reference location (e.g., a location within a particular geographical area). Here, the known reference location may be the same reference location used when compressing the geospatial location. Other methods for determining a prediction of the geospatial location to be decompressed may include looking at statistical averages, using the previous point in a series (e.g., a series of geospatial locations such as those sent to represent an entity or set of entities) as the prediction (e.g., when the geospatial location to be decompressed is one of a set of geospatial locations to be decompressed), or in the case of time-series data (e.g., when the geospatial location to be decompressed is one of a set of geospatial locations associated with a moving object) extrapolating based on a moving object's speed, heading, and last location. For example, when decompressing a set of geospatial location, a previously decompressed geospatial location may serve as a basis for a prediction of a current geospatial location to be decompressed.

A geometrical projection of the Earth can then be defined at step 430 and subdivided at step 440. Again, the geometrical projection may be equivalent to (or the same as or substantially similar to) the geometrical projection used during compression of the geospatial location. Therefore, in one embodiment, a QSC projection may be created during decompression, where the prediction created (e.g., the predicted geospatial location determined at step 420) is in one of the corners of the cubic projection. The cubic projection may thus be created such that the geospatial location of the prediction is located at, or close to, the corner of the cubic projection. The faces of this cubic projection can also be subdivided. At step 450 the vertex of the cubic projection corresponding to the integer (or other) value of the compressed geospatial location can be determined. This determined vertex is then projected back to its corresponding latitude and longitudinal location (or other coordinate system location) on Earth at step 460 to determine the decompressed geospatial location (e.g., the latitude and longitude value corresponding to the determined location on Earth).

In certain embodiments, to determine the vertex of the cubic projection corresponding to the integer value of the compressed geospatial location the vertices created by the subdivisions (e.g., the intersections of the axes used to subdivide the cubic projection) can be assigned identifiers. Again, the geometrical projection may be equivalent to (or the same as or substantially similar to) the geometrical projection used during compression of the geospatial location. Therefore, in one embodiment, the vertices of the cubic projection defined by the subdivisions can be assigned identifiers using the number of subdivisions per face and an ordering scheme equivalent to the number of subdivisions and ordering scheme utilized during the compression of the geospatial location (e.g., at steps 240, 250). At this point then, during decompression, a prediction and cubic projection with subdivisions and vertices with numerical identifiers equivalent to those created during compression have been created. It will be noted here, that this step is given by way of illustration only, and that such an ordering may be implicit and identifiers of the vertices need not be explicitly assigned or stored. As will be realized from this disclosure, the identifier associated with a particular vertex may be determined at the time a nearest vertex to a prediction is determined as discussed herein, and only the identifier associated with a particular vertex or set of vertices may need to be determined.

So, looking back at FIG. 3D, during the decompression of the example discussed, a substantially identical subdivided cubic projection with identifiers assigned to the vertices as depicted would be created. Thus, during decompression vertex 306*a* corresponding to the prediction (e.g., the prediction vertex) is created during decompression and is assigned numerical identifier "0", vertex 306*b* is assigned the numerical identifier "1", vertex 306*c* is assigned the numerical identifier "2", vertex 306*d* is assigned the numerical identifier "3", vertex 306*e* is assigned the numerical identifier "4", vertex 306*f* is assigned the numerical identifier "5" and so on such that the vertices 306 are assigned increasing numerical identifiers according to a spiral pattern beginning with the prediction vertex 306*a* (e.g., vertex zero) and increasing in a clockwise or counter-clockwise pattern around the prediction vertex 306*a*.

Again, using the example depicted with respect to FIG. 3E, during the decompression of the example vertex 306*j*, corresponding to the numerical identifier 20, is located on cubic projection 300. This vertex 306*j* can then be projected back to its corresponding latitude and longitudinal location on Earth to determine the decompressed latitude and longitude value.

These, and other, aspects of the disclosure and various features and advantageous details thereof are explained more fully with reference to the exemplary, and therefore non-limiting, embodiments illustrated and detailed in the accompanying appendices. It should be understood, however, that the detailed description and the specific examples, while indicating some embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive subject matter will become apparent to those skilled in the art from this disclosure, including the accompanying appendices.

Although the invention has been described with respect to specific embodiments thereof, these embodiments are merely illustrative, and not restrictive of the invention. Rather, the description is intended to describe illustrative embodiments, features and functions in order to provide a person of ordinary skill in the art context to understand the invention without limiting the invention to any particularly described embodiment, feature or function.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Embodiments discussed herein can be implemented in a computer communicatively coupled to a network (for example, the Internet), another computer, or in a standalone computer. As is known to those skilled in the art, a suitable computer can include a central processing unit ("CPU"), at least one read-only memory ("ROM"), at least one random access memory ("RAM"), at least one hard drive ("HD"), and one or more input/output ("I/O") device(s). The I/O devices can include a keyboard, monitor, printer, electronic pointing device (for example, mouse, trackball, stylus, touch pad, etc.), or the like. ROM, RAM, and HD are computer memories for storing computer-executable instructions executable by the CPU or capable of being compiled or interpreted to be executable by the CPU. Suitable computer-executable instructions may reside on a computer readable medium (e.g., ROM, RAM, and/or HD), hardware circuitry or the like, or any combination thereof. Within this disclosure, the term "computer readable medium" is not limited to ROM, RAM, and HD and can include any type of data storage medium that can be read by a processor. For example, a computer-readable medium may refer to a data cartridge, a data backup magnetic tape, a floppy diskette, a flash memory drive, an optical data storage drive, a CD-ROM, ROM, RAM, HD, or the like. The processes described herein may be implemented in suitable computer-executable instructions that may reside on a computer readable medium (for example, a disk, CD-ROM, a memory, etc.). Alternatively, the computer-executable instructions may be stored as software code components on a direct access storage device array, magnetic tape, floppy diskette, optical storage device, or other appropriate computer-readable medium or storage device.

Any suitable programming language can be used to implement the routines, methods or programs of embodiments of the invention described herein, including C, C++, Java, JavaScript, Python, or any other programming or scripting code, etc. Other software/hardware/network architectures may be used. For example, the functions of the disclosed embodiments may be implemented on one computer or shared/distributed among two or more computers in or across a network. Communications between computers implementing embodiments can be accomplished using any electronic, optical, radio frequency signals, or other suitable methods and tools of communication in compliance with known network protocols.

Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps and operations described herein can be performed in hardware, software, firmware or any combination thereof.

Embodiments described herein can be implemented in the form of control logic in software or hardware or a combination of both. The control logic may be stored in an information storage medium, such as a non-transitory computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code an of the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more general purpose digital computers, by using application specific integrated circuits, programmable logic devices, field programmable gate arrays, optical, chemical, biological, quantum or nanoengineered systems, components and mechanisms may be used. In general, the functions of the invention can be achieved by any means as is known in the art. For example, distributed, or networked systems, components and circuits can be used. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. Such computer-readable medium shall generally be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any, hardware system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term (i.e., that the reference "a" or "an" clearly indicates only the singular or only the plural). Also, as used in the description herein, the meaning of "in" includes "in" and "on" unless the context clearly dictates otherwise.

What is claimed is:

1. A geospatial information system, comprising
   a processor;
   a data store;
   a non-transitory computer readable medium, comprising instructions for compressing a geospatial location, the instructions executable on the processor for compressing the geospatial location to a compressed geospatial location by:
   determining the geospatial location to be compressed, the geospatial location represented in a coordinate system;
   determining a first prediction for the geospatial location to be compressed;
   defining a geometrical projection of the Earth, the geometrical projection having a set of faces, wherein the geometrical projection is oriented based on the first prediction;
   subdividing the geometrical projection of the Earth to create a set of vertices on each face of the geometrical projection of the Earth;
   projecting the geospatial location to be compressed onto the geometrical projection of the Earth, wherein the geospatial location is projected at a point on a face of the set of faces of the geometrical projection;
   determining an identifier for a vertex of the set of vertices of the face of the geometrical projection that is closest to the point on the face of the geometrical projection corresponding to the geospatial location, wherein determining the identifier comprises assigning identifiers to the set of vertices of the face of the geometrical projection and determining the identifier for the vertex that is closest to the point on the face associated with the projected geospatial location; and
   encoding the identifier to generate the compressed geospatial location corresponding to the geospatial location to be compressed.

2. The system of claim 1, wherein the non-transitory computer readable medium further comprises instructions for decompressing the compressed geospatial location to determine a decompressed geospatial location by:
   receiving the compressed geospatial location;
   determining a second prediction for the geospatial location to be compressed;
   defining the geometrical projection of the Earth, the geometrical projection having the set of faces, wherein the geometrical projection is oriented based on the second prediction;
   subdividing the geometrical projection of the Earth to create the set of vertices on each face of the geometrical projection of the Earth;
   determining the vertex of the cubic projection corresponding to the identifier of the compressed geospatial location; and projecting the vertex back to a corresponding location on Earth, wherein the corresponding location is the decompressed geospatial location in the coordinate system.

3. The system of claim 1, wherein the geometrical projection is a cubic projection.

4. The system of claim 3, wherein the geometrical projection is defined such that the prediction is located at a corner of the cubic projection.

5. The system of claim 4, wherein subdividing each face of the cubic projection comprises subdividing each face of the cubic projection into a number of horizontal axes and a number of a vertical axes.

6. The system of claim 5, wherein the number of horizontal axes and the number of vertical axes are based on a desired amount of compression.

7. The system of claim 5, wherein the identifiers are assigned by assigning increasing numerical identifiers according to a ring order beginning with a prediction vertex corresponding to the corner of the cubic projection.

8. The system of claim 7, wherein assigning numerical identifiers to the set of vertices of the face of the geometrical projection comprises determining only the numerical identifier for the vertex of the face of the geometrical projection to be compressed that is closest to the point on the face of the geometrical projection.

9. The system of claim 1, wherein the first prediction is determined based on a known reference location, a previous point in a series including the geospatial location or extrapolating the first prediction based on a speed or heading of an entity associated with the geospatial location to be compressed.

10. A method for compressing a geospatial location to a compressed geospatial location, the method comprising:
determining a geospatial location to be compressed, the geospatial location represented in a coordinate system;
determining a first prediction for the geospatial location to be compressed;
defining a geometrical projection of the Earth, the geometrical projection having a set of faces, wherein the geometrical projection is oriented based on the first prediction;
subdividing the geometrical projection of the Earth to create a set of vertices on each face of the geometrical projection of the Earth;
projecting the geospatial location to be compressed onto the geometrical projection of the Earth, wherein the geospatial location is projected at a point on a face of the set of faces of the geometrical projection;
determining an identifier for a vertex of the set of vertices of the face of the geometrical projection that is closest to the point on the face of the geometrical projection corresponding to the geospatial location, wherein determining the identifier comprises assigning identifiers to the set of vertices of the face of the geometrical projection and determining the identifier for the vertex that is closest to the point on the face associated with the projected geospatial location; and
encoding the identifier to generate the compressed geospatial location corresponding to the geospatial location to be compressed.

11. The method of claim 10, wherein the non-transitory computer readable medium further comprises instructions for decompressing the compressed geospatial location to determine a decompressed geospatial location by:
receiving the compressed geospatial location;
determining a second prediction for the geospatial location to be compressed;
defining the geometrical projection of the Earth, the geometrical projection having the set of faces, wherein the geometrical projection is oriented based on the second prediction;
subdividing the geometrical projection of the Earth to create the set of vertices on each face of the geometrical projection of the Earth;
determining the vertex of the cubic projection corresponding to the identifier of the compressed geospatial location; and
projecting the vertex back to a corresponding location on Earth, wherein the corresponding location is the decompressed geospatial location in the coordinate system.

12. The method of claim 10, wherein the geometrical projection is a cubic projection.

13. The method of claim 12, wherein the geometrical projection is defined such that the prediction is located at a corner of the cubic projection.

14. The method of claim 13, wherein subdividing each face of the cubic projection comprises subdividing each face of the cubic projection into a number of horizontal axes and a number of a vertical axes.

15. The method of claim 14, wherein the number of horizontal axes and the number of vertical axes are based on a desired amount of compression.

16. The method of claim 14, wherein the identifiers are assigned by assigning increasing numerical identifiers according to a ring order beginning with a prediction vertex corresponding to the corner of the cubic projection.

17. The method of claim 16, wherein assigning numerical identifiers to the set of vertices of the face of the geometrical projection comprises determining only the numerical identifier for the vertex of the face of the geometrical projection to be compressed that is closest to the point on the face of the geometrical projection.

18. The method of claim 10, wherein the first prediction is determined based on a known reference location, a previous point in a series including the geospatial location or extrapolating the first prediction based on a speed or heading of an entity associated with the geospatial location to be compressed.

* * * * *